United States Patent
Tsuchiya et al.

(10) Patent No.: US 7,569,891 B2
(45) Date of Patent: Aug. 4, 2009

(54) SEMICONDUCTOR DEVICE WITH REDUCED CONTACT RESISTANCE AND METHOD FOR MANUFACTURING THE SAME

(75) Inventors: Yoshinori Tsuchiya, Yokohama (JP); Masato Koyama, Kanagawa-Ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/709,857

(22) Filed: Feb. 23, 2007

(65) Prior Publication Data

US 2007/0215956 A1    Sep. 20, 2007

(30) Foreign Application Priority Data

Mar. 15, 2006    (JP) .............. 2006-071350

(51) Int. Cl.
 *H01L 29/76*    (2006.01)
 *H01L 29/94*    (2006.01)
 *H01L 31/062*   (2006.01)
 *H01L 31/113*   (2006.01)
 *H01L 31/119*   (2006.01)

(52) U.S. Cl. .............. 257/369; 257/E27.062; 257/382

(58) Field of Classification Search ............ 257/204, 257/213–413, E27.062
See application file for complete search history.

(56) References Cited

U.S. PATENT DOCUMENTS

2005/0127451 A1*  6/2005  Tsuchiya et al. ............ 257/371
2006/0038229 A1   2/2006  Tsuchiya et al.
2006/0163624 A1*  7/2006  Kuroi ....................... 257/288

FOREIGN PATENT DOCUMENTS

JP    2005-101588    4/2005

OTHER PUBLICATIONS

Hiroyuki Kanaya et al., "Reduction of the Barrier Height of Silicide / p-$Si_{1-x}Ge_x$ Contact for Appication in an Infared Image Sensor," Japanese Journal of Applied Physics, vol. 28, No. 4, pp. L544-L546 (Apr. 1989).

* cited by examiner

*Primary Examiner*—Monica Lewis
(74) *Attorney, Agent, or Firm*—Finnegan, Herderson, Farabow, Garrett & Dunner, L.L.P.

(57) ABSTRACT

It is made possible to reduce the contact resistance of the source and drain in an n-type MISFET. A semiconductor device includes: a source and drain regions provided in a p-type semiconductor substrate so as to separate each other, each including: a silicide layer containing a first metal element as a main component having a vacuum work function of 4.6 eV or greater; and a layer containing at least one second metal element selected from the group of scandium elements and lanthanoid, the layer containing the second metal element including a segregating layer in which the highest areal density is $1 \times 10^{14}$ cm$^{-2}$ or higher, each region of the segregating layer with areal density of $1 \times 10^{14}$ cm$^{-2}$ or higher having a thickness smaller than 1 nm; a gate insulating film provided a region between the source and drain regions on the semiconductor substrate; and a gate electrode provided on the gate insulating film.

6 Claims, 8 Drawing Sheets

SEMICONDUCTOR DEVICE WITH REDUCED CONTACT RESISTANCE AND METHOD FOR MANUFACTURING THE SAME

CROSS-REFERENCE TO RELATED APPLICATION

This application is based upon and claims the benefit of priority from prior Japanese Patent Application No. 2006-71350 filed on Mar. 15, 2006 in Japan, the entire contents of which are incorporated herein by reference.

BACKGROUND OF THE INVENTION

1. Field of the Invention

The present invention relates to a semiconductor device and a method for manufacturing the semiconductor device, and more particularly, to a CMIS device that forms a silicon super-integrated circuit for performing advanced information processing and a method for manufacturing the CMIS device.

2. Related Art

"Silicon large-scale integrated circuit" is one of the fundamental technologies that will support the highly sophisticated information society in the future. To obtain a high-performance integrated circuit, it is necessary to develop high-performance CMIS devices that constitute such an integrated circuit. The performance of each device has been improved generally by the scaling rule. In recent years, however, it has been difficult to attain high performances by minute devices and to operate such devices, due to various physical limitations. One of the problems here is the increase in parasitic resistance in the source and drain regions that exists in series with the channel resistance. Particularly, the increase in contact resistance at the interface between the silicide and the silicon has become a serious problem. The contact resistance increases as the contact size becomes smaller with the reduction in device size. In the 32-nm technology generation and later, the contact resistance is considered to account for 50% of the parasitic resistance. To reduce the parasitic resistance, the active impurity in the diffusion layer that serves as the source and drain needs to have high concentration, and the Schottky barrier height needs to be smaller.

However, impurities cannot be made active beyond the solid solubility limit. In a case where a CMIS device is to be produced, the Schottky barrier height cannot be made smaller for both an n-type MISFET and a p-type MISFET at the same time. Therefore, two different types of contact materials are required for the n-type MISFET and the p-type MISFET. This leads to a more complicated manufacturing process.

Attempts have been made to reduce the Schottky barrier height by forming the source and drain with a semiconductor having a narrow band gap, such as SiGe or Ge (see JJAP 28(1989) L544-L546, H. Kanaya et al., for example). Such attempts have reduced the barrier height with respect to holes, but have not reduced the barrier height with respect to electrons. As a result, there has been a demand for a technique for reducing the contact resistance for both an n-type MISFET and a p-type MISFET at the same time through a simple manufacturing process.

Meanwhile, a technique for reducing the Schottky barrier height by segregating a nonmetal element to be a dopant for silicon at the interface has been known. In a case of a CMIS-FET, however, it is necessary to segregate different elements for an n-type MISFET and a p-type MISFET. The difference in silicide formation speed during the segregation makes integration difficult (see JP-A 2005-101588 (KOKAI), for example).

As described above, the electric resistance (contact resistance) at the interface between the diffusion layer to be the source and drain of each MISFET and the silicide layer formed on the diffusion layer needs to be lowered so as to operate the device at a high speed. Attempts have been made to reduce the interfacial resistance (or the Schottky barrier height) by forming the diffusion layer with a semiconductor having a narrow band gap, but have failed to reduce the contact resistance of a MISFET, especially the contact resistance of the source and drain of an n-type MISFET.

SUMMARY OF THE INVENTION

The present invention has been made in view of those circumstances, and an object thereof is to provide a semiconductor device that can reduce the contact resistance of the source and drain in an n-type MISFET, and a method for manufacturing the semiconductor device.

A semiconductor device according to a first aspect of the present invention includes: a p-type semiconductor substrate; a first source and drain regions provided in the semiconductor substrate so as to separate each other, each of the first source and drain regions including: an n-type diffusion layer; a silicide layer formed on the n-type diffusion layer and containing a first metal element as a main component having a vacuum work function of 4.6 eV or greater; and a layer containing at least one second metal element selected from the group of scandium elements and lanthanoid, the layer containing the second metal element including a segregating layer in which the highest areal density is $1 \times 10^{14}$ cm$^{-2}$ or higher, a region of the segregating layer with areal density of $1 \times 10^{14}$ cm$^{-2}$ or higher having a thickness smaller than 1 nm; a first gate insulating film provided a region between the first source and drain regions on the semiconductor substrate; and a first gate electrode provided on the first gate insulating film.

A semiconductor device according to a second aspect of the present invention includes:

a semiconductor substrate that has a p-type semiconductor region and an n-type semiconductor region;

an n-type MISFET that includes:

a first source and drain regions provided in the p-type semiconductor region so as to separate each other, each of the first source and drain regions including: an n-type diffusion layer; a first silicide layer formed on the n-type diffusion layer and containing a first metal element as a main component having a vacuum work function of 4.6 eV or greater; and a layer containing at least one second metal element selected from the group of scandium elements and lanthanoid, the layer containing the second metal element including a segregating layer in which the highest areal density is $1 \times 10^{14}$ cm$^{-2}$ or higher, a region of the segregating layer with areal density of $1 \times 10^{14}$ cm$^{-2}$ or higher having a thickness smaller than 1 nm;

a first gate insulating film provided a region between the first source and drain regions on the p-type semiconductor region; and a first gate electrode provided on the first gate insulating film; and a p-type MISFET that includes:

a second source and drain regions provided in the n-type semiconductor region so as to separate each other, each of the second source and drain regions including: a p-type diffusion layer in the n-type semiconductor region; and a second silicide layer formed on the p-type diffusion layer and containing the first metal element as a main component;

a second gate insulating film provided on the n-type semiconductor region; and a second gate electrode provided on the second gate insulating film.

A semiconductor device according to a third aspect of the present invention includes: a p-type semiconductor substrate; a source and drain regions provided in the p-type semiconductor substrate so as to separate each other, each of the source and drain regions including: a silicide layer containing a first metal element as a main component having a vacuum work function of 4.6 eV or greater; and a layer containing at least one second metal element selected from the group of scandium elements and lanthanoid, the layer containing the second metal element including a segregating layer in which the highest areal density is $1 \times 10^{14}$ cm$^{-2}$ or higher, each region of the segregating layer with areal density of $1 \times 10^{14}$ cm$^{-2}$ or higher having a thickness smaller than 1 nm; a gate insulating film provided a region between the source and drain regions on the semiconductor substrate; and a gate electrode that is provided on the gate insulating film.

A method for manufacturing a semiconductor device according to a fourth aspect of the present invention includes: implanting ions of one element selected from the group of scandium elements and lanthanoid into an impurity diffusion region that is formed on a semiconductor substrate and is to be a source and drain; and segregating the selected element at an interface between a silicide layer and the impurity diffusion region or an interface between the silicide layer and the semiconductor substrate, while covering the impurity diffusion region with a metal having a vacuum work function of 4.6 eV or greater and carrying out a heat treatment on the metal so as to form the silicide layer of the metal in the impurity diffusion region.

DETAILED DESCRIPTION OF THE INVENTION

The following is a description of embodiments of the present invention, with reference to the accompanying drawings.

First Embodiment

Figure 1:
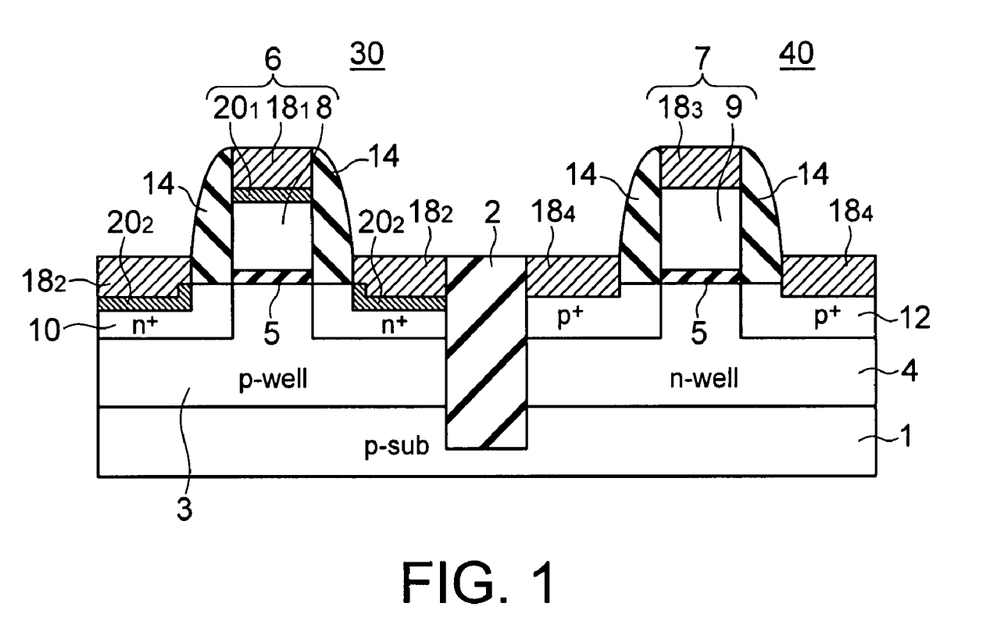
FIG. 1 is a cross-sectional view of a semiconductor device in accordance with a first embodiment of the present invention.

FIG. 1 is a cross-sectional view of a semiconductor device in accordance with a first embodiment of the present invention. The semiconductor device of this embodiment is a CMISFET that includes an n-type MISFET 30 and a p-type MISFET 40. The n-type MISFET 30 and the p-type MISFET 40 are formed in a p-type impurity region (a p-type well) 3 and an n-type impurity region (an n-type well) 4 formed in a p-type silicon substrate 1, respectively. The p-type well 3 and the n-type well 4 are isolated from each other by device isolating region 2 made of $SiO_2$.

In the n-type MISFET 30, a gate insulating film 5 made of $SiO_2$ is formed on the p-type well 3, and a gate electrode 6 is formed on the gate insulating film 5. This gate electrode 6 has a laminated structure that includes a polycrystalline silicon layer 8, a Ni silicide layer $18_1$, and an Er segregating layer $20_1$. The polycrystalline silicon layer 8 is formed on the gate insulating film 5, and has an n-type impurity such as phosphorus added thereto at high concentration ($1 \times 10^{19}$ atoms cm$^{-3}$ or higher). The Ni silicide layer $18_1$ is formed on the polycrystalline silicon layer 8, and is made of $Ni_3Si$. The Er segregating layer $20_1$ is formed at the interface between the polycrystalline silicon layer 8 and the Ni silicide layer $18_1$, and has Er (erbium) segregated with areal density of $1 \times 10^{14}$ atoms cm$^{-2}$ or higher. Although phosphorus is used as the impurity added to the polycrystalline silicon layer 8 of the gate electrode 6 in this embodiment, arsenic may be used instead. The impurity concentration in the polycrystalline silicon is adjusted so that the work function of the gate electrode 6 becomes 3.75 eV to 4.35 eV. Accordingly, a high-speed operation can be performed.

At the portions in the p-type well 3 at both sides of the gate electrode 6, n$^+$-type diffusion layers 10 are formed. Further, a Ni silicide layer $18_2$ that is made of $Ni_3Si$ and serves as a contact electrode is formed on each of the n$^+$-type diffusion layers 10. Also, an Er segregating layer $20_2$ is formed at the interface between each n$^+$-type diffusion layer 10 and each Ni silicide layer $18_2$, and has Er (erbium) segregated with areal density of $1 \times 10^{14}$ atoms cm$^{-2}$ or higher. The n$^+$-type diffusion layers 10, the Er segregating layers $20_2$, and the Ni silicide layers $18_2$ form the source and drain.

The gate electrode 6 and the Ni silicide layers $18_2$ on the n$^+$-type diffusion layers 10 are electrically insulated from each other by gate sidewalls 14 formed with insulating members provided at both sides of the gate electrode 6. The Er segregating layer $20_1$ and the Er segregating layers $20_2$ have the maximum areal density of $1\times10^{14}$ atoms cm$^{-2}$ or higher, and the thickness of each region with the areal density of $1\times10^{14}$ atoms cm$^{-2}$ or higher is smaller than 1 nm.

Meanwhile, in the p-type MISFET 40, a gate insulating film 5 made of SiO$_2$ is formed on the n-type well 4, and a gate electrode 7 is formed on the gate insulating film 5. This gate electrode 7 has a laminated structure that includes a polycrystalline silicon layer 9 and a Ni silicide layer 18$_3$. The polycrystalline silicon layer 9 is formed on the gate insulating film 5, and has a p-type impurity such as boron added thereto at high concentration ($1\times10^{19}$ atoms cm$^{-3}$ or higher). The Ni silicide layer 18$_3$ is formed on the polycrystalline silicon layer 9, and is made of Ni$_3$Si. The impurity concentration in the polycrystalline silicon is adjusted so that the work function of the gate electrode 7 becomes 4.87 eV to 5.47 eV. Accordingly, a high-speed operation can be performed.

At the portions in the n-type well 4 at both sides of the gate electrode 7, p$^+$-type diffusion layers 12 are formed. Further, a Ni silicide layer 18$_4$ that is made of Ni$_3$Si and serves as a contact electrode is formed on each of the p$^+$-type diffusion layers 12. The p$^+$-type diffusion layers 12 and the Ni silicide layers 18$_4$ made of Ni$_3$Si form the source and drain. The gate electrode 7 and the Ni silicide layers 18$_4$ on the p$^+$-type diffusion layers 12 are electrically insulated from each other by gate sidewalls 14 formed with insulating members provided at both sides of the gate electrode 7.

In this embodiment, the length of each gate structure formed with a gate insulating film and a gate electrode between the source and drain (the gate length) is preferably 30 nm or smaller.

In this embodiment, the n-type MISFET 30 and the p-type MISFET 40 work complementarily to each other, so as to form a CMISFET.

In this embodiment, the silicide layers 18$_2$ and 18$_4$ made of Ni$_3$Si are formed on the diffusion layers 10 and 12. The vacuum work function of NiSi (a Ni silicide phase of a composition of Ni:Si=1:1) that is normally used as a silicide is 4.6 eV, and the Fermi level is equivalent to the midgap of Si. Accordingly, the silicide layers 18$_2$ and 18$_4$ have the same Schottky barrier height of 0.6 eV with respect to electrons or holes. Here, the vacuum work function is the energy difference between the Fermi level of metal and the vacuum level, and is measured by ultraviolet photoelectron spectroscopy.

For the p-type MISFET 40, the silicide of the source and drain should preferably have a vacuum work function of greater than 4.6 eV, so as to reduce the contact resistance. As the Ni composition increases, the vacuum work function of the Ni silicide increases to 4.8 eV in the case of Ni$_2$Si, and to 4.9 eV in the case of Ni$_3$Si, approaching to the vacuum work function of Ni (5.15 eV). If the Schottky barrier height at the interface between the silicide and the silicon (Si) is determined by the difference between the vacuum work function of the silicide and the electron affinity of Si, SBH is modulated in synchronization with the variation of the work function of the silicide. In reality, however, the variation of SBH is smaller than the variation of the vacuum work function of the silicide, because of the MIGS (Metal Induced Gap States) formed at the interface between the metal and the semiconductor. This relationship is normally expressed as $\Delta$SBH=S$\times\Delta\Phi$, using a pinning coefficient (S). Here, "$\Delta$SBH" indicates the variation of SBH, and "$\Delta\Phi$" indicates the variation of the work function of the metal. The pinning coefficient (S) at the interface between the silicide and Si is known to be approximately 0.3.

The 0.3 eV increase in the work function due to the change of the silicide material from NiSi to Ni$_3$Si in this embodiment can cause a SBH increase of 0.1 eV for electrons and a SBH decrease of 0.1 eV for holes, compared with a case where NiSi is used as the silicide as in a conventional case. Accordingly, in the p-type MISFET 40, the contact resistance can be reduced from about $1\times10^{-7}$ $\Omega\cdot$cm$^2$, which is the contact resistance in the case of Nisi, to about $5\times10^{-8}$ $\Omega\cdot$cm$^2$. Thus, after the 45-nm technology generation, the contact resistance (interfacial resistance) necessary for high-speed operations of p-type MISFETs can be achieved.

Although a Ni silicide is used as the silicide layer in this embodiment, it is of course effective to use a silicide of another metal element with a vacuum work function of 4.6 eV or greater. Especially, CO$_3$Si, Pt$_3$Si, and Pd$_5$Si, which are cobalt (Co (5.0V)), platinum (5.6 eV)), and palladium (5.1 eV)) with large vacuum work functions, and are the silicides with the greatest metal compositions, can be formed at low temperatures. Accordingly, such silicides are compatible with the current manufacturing process, and a larger metal composition is more preferable as it has a larger modulated width.

Figure 2:
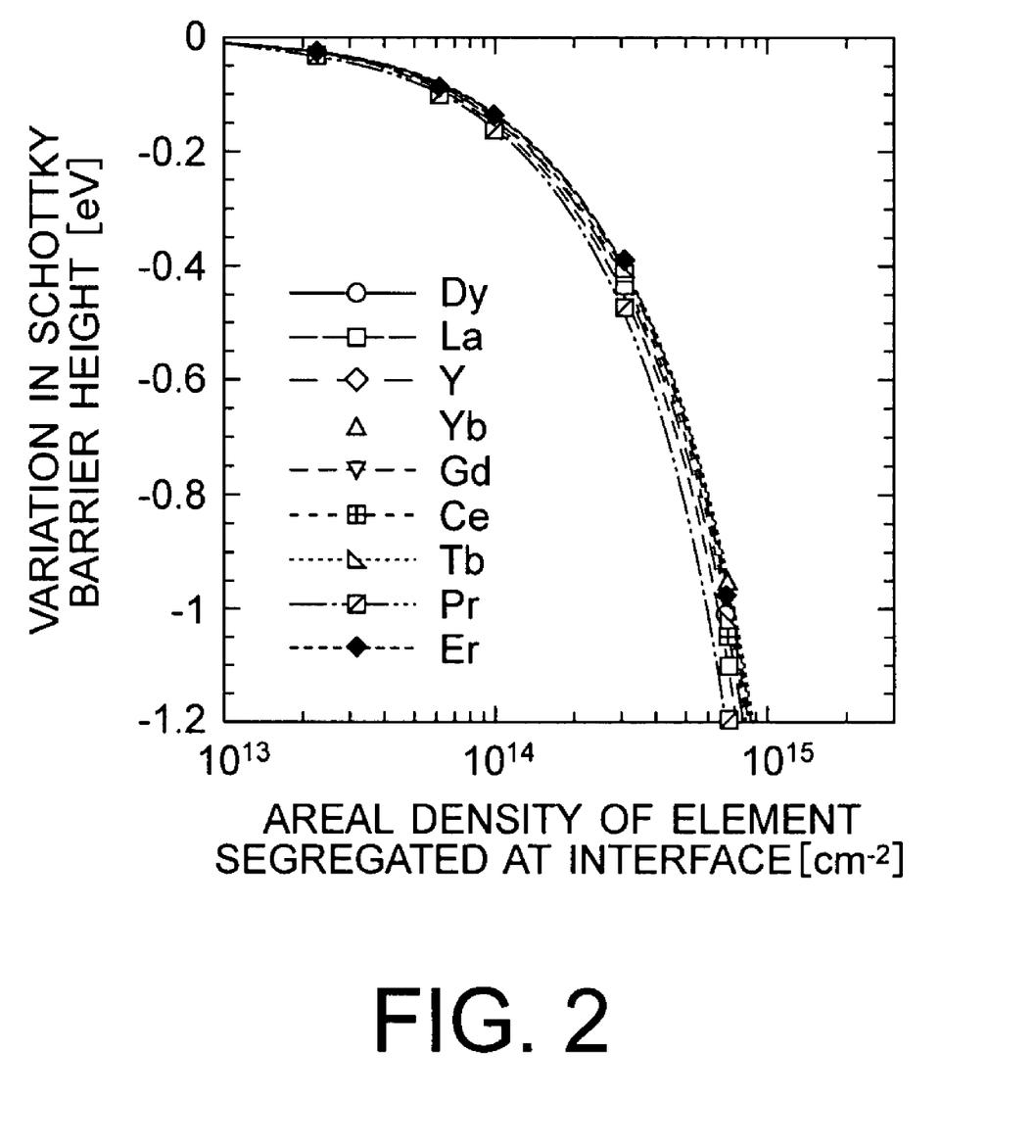
FIG. 2 shows the relationship between the variation in Schottky barrier height and the areal density of the element segregated at the interface between silicon and the silicide layer.

FIG. 2 shows the dependence of the Schottky barrier height (SBH) for electron on scandium or lanthanoid segregated at the interface between the Ni silicide and the silicon. As can be seen from FIG. 2, as the segregation concentration of scandium and lanthanoid at the interface increases, the SBH with respect to electrons becomes smaller, and the decrease in SBH becomes remarkable when the Er concentration is $1\times10^{14}$ cm$^{-2}$ or higher. In this manner, an element that has a smaller vacuum work function than the vacuum work function of the main-component metal element (Ni in this embodiment) is added to the vicinity of the interface between the Ni silicide and the silicon, so as to reduce the SBH with respect to electrons.

As described above, in the n-type MISFET 30 of this embodiment, the Er segregating layers 20$_2$ are formed at the interface between the diffusion layers 10 and the silicide layers 18$_2$. With this arrangement, the SBH with respect to electrons is reduced by the Er element of the Er segregating layers 20$_2$, and the n-type MISFET 30 can be operated at high speeds. As a result, the n-type and p-type MISFETS 30 and 40 can be operated at high speeds, and the complementary MISFET can be operated at high speeds.

Although Er is segregated at the interface in this embodiment, scandium or lanthanoid may be segregated at the interface as shown in FIG. 2, so as to achieve the same effects.

The gate electrodes 6 and 7 may be both replaced with a material such as a metal material, a metal nitride, a metal carbide, or a metal germanide. The gate electrode material should be selected in accordance with the operational threshold voltage required for the technology generation of the device.

Although silicon dioxide is used as the material of each gate insulating film in this embodiment, a high-permittivity (high-k) material with higher permittivity than silicon dioxide may be used. Examples of high-permittivity materials include Si$_3$N$_4$, Al$_2$O$_3$, Ta$_2$O$_5$, TiO$_2$, La$_2$O$_5$, CeO$_2$, ZrO$_2$, HfO$_2$, SrTiO$_3$, and Pr$_2$O$_3$. Such a material as Zr silicate or Hf silicate that has metal ions mixed with a silicon oxide may also be used, and a combination of those materials may be used. A material or materials that are required for each generation of transistors should be selected. In the embodiments that will be described later, each gate insulating film is a silicon oxide film, or may be replaced with a high-permittivity insulating film, unless otherwise mentioned.

As described so far, in accordance with this embodiment, the interfacial resistance (contact resistance) at the interface between the diffusion layers of the n-type MISFET and the p-type MISFET and the silicide can be reduced, and a CMISFET that can be operated at a high speed can be obtained.

Second Embodiment

Figure 3:
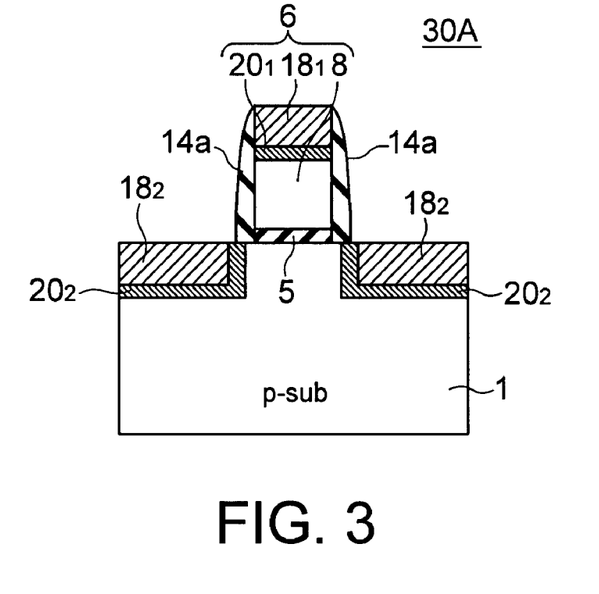
FIG. 3 is a cross-sectional view of a semiconductor device in accordance with a second embodiment.

FIG. 3 is a cross-sectional view of a semiconductor device in accordance with a second embodiment of the present invention. The semiconductor device of this embodiment is a Schottky n-type MISFET 30A that has the same structure as the n-type MISFET 30 of the first embodiment shown in FIG. 1 minus the n$^+$-type diffusion layers 10. The n-type MISFET 30A of this embodiment is formed on a p-type silicon substrate 1. More specifically, silicide layers 18$_2$ made of Ni$_3$Si are in contact with the p-type silicon substrate 1. In this embodiment, the silicide layers 18$_2$ made of Ni$_3$Si serve as the source and drain. Er segregating layers 20$_2$ having Er segregated with areal density of $2\times10^{14}$ cm$^{-2}$ or higher are formed at the interfaces between the silicide layers 18$_2$ and the p-type silicon substrate 1. The thickness of each Er segregating layer 20$_2$ is smaller than 1 nm. The thickness of each gate sidewall 14a is also smaller than each gate sidewall 14 of the n-type MISFET 30 shown in FIG. 1, being 10 nm or less.

This embodiment is a Schottky MIS transistor. To achieve high-speed device operations in a Schottky MIS transistor, it is necessary to reduce the SBH at the source end. Especially in a transistor of a Schottky type, the impurity concentration on the Si side is low, and a SBH decrease can greatly reduce the contact resistance at the interface. Accordingly, with the structure of this embodiment, the on-current of the transistor dramatically increases.

Unlike the p-type MISFET in the first embodiment, a silicide layer made of Ni$_3$Si as a Schottky p-type MISFET may be formed directly on the n-type well. In such a Schottky p-type MISFET, the interfacial resistance (contact resistance) can be reduced. In this case, however, the Er segregating layers at the interface do not exist. This Schottky p-type MISFET and the Schottky n-type MISFET of this embodiment are formed on the same silicon substrate, so as to obtain a Schottky CMISFET.

In the embodiments described hereafter, the diffusion layers exist in each structure, but it is possible to employ a Schottky structure when appropriate. A most suitable structure should be employed for each technology generation.

As described above, in accordance with this embodiment, the interfacial resistance between the silicide and the source and drain of the n-type MISFET can be reduced.

Third Embodiment

Figure 4:
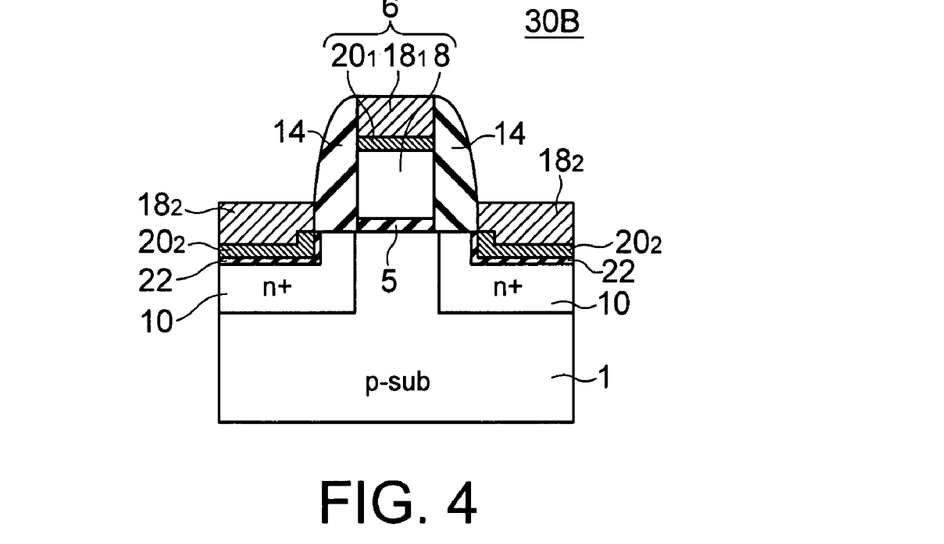
FIG. 4 is a cross-sectional view of a semiconductor device in accordance with a third embodiment.

FIG. 4 is a cross-sectional view of a semiconductor device in accordance with a third embodiment of the present invention. The semiconductor device of this embodiment is an n-type MISFET 30B that has the same structure as the n-type MISFET 30 of the first embodiment shown in FIG. 1, except that 0.5-nm thick silicon nitride films 22 are provided between the n$^+$-type diffusion layers 10 and the silicide layers 18$_2$ made of Ni$_3$Si. Further, the n-type MISFET 30B of this embodiment is formed on a p-type silicon substrate 1, instead of a p-type well. However, the n-type MISFET 30B may be formed on a p-type well, instead of the p-type silicon substrate 1. Er segregating layers 20$_2$ exist on the sides of the silicide layers 18$_2$ with respect to the silicon nitride films 22.

In a structure that has the silicon nitride films 22 serving as interface layers between the n$^+$-type diffusion layers 10 and the silicide layers 18$_2$ made of Ni$_3$Si as in this embodiment, the Fermi-level pinning phenomenon that is normally caused at the interface between a silicide layer and silicon can be reduced by the interface layers 22 formed with silicon nitride having a wider band gap, and the SBH varies with the vacuum work function of the electrode. With the silicon nitride films 22 being used as the interface layers, the size of the variation in SBH is twice to three times larger than that in a case where interface layers are not formed. As a result, the SBH with respect to electrons decreases to a value ranging from 0.1 eV to 0.2 eV, and the contact resistance (interfacial resistance) is reduced to a tenth or less of the contact resistance caused in a case where the silicon nitride films 22 are not provided.

Although silicon nitride films are used as the interface layers in this embodiment, the same effects as above can be achieved by forming the interface layers other films made of a material having a wide band gap and it makes the size of the variation in SBH become larger. However, if the film thickness of each interface layer is 2 nm or more, the contact resistance becomes high due to the wide band gap. Therefore, when films made of a material having a wide band gap are used as the interface layers, the thickness of each of the films should be made small in accordance with the width of the band gap, so as not to increase the contact resistance.

Also, in a p-type MISFET, the contact resistance can be reduced by forming interface layers with silicon nitride films between the p$^+$-type diffusion layers and the silicide layers made of Ni$_3$Si. In such a case, however, Er segregating layers do not exist between the silicide and the silicon nitride films. This p-type MISFET and the n-type MISFET of this embodiment are formed on the same silicon substrate, so as to obtain a CMISFET.

As described above, in accordance with this embodiment, the interfacial resistance between the silicide and the source and drain of the n-type MISFET can be reduced.

Fourth Embodiment

Figure 5:
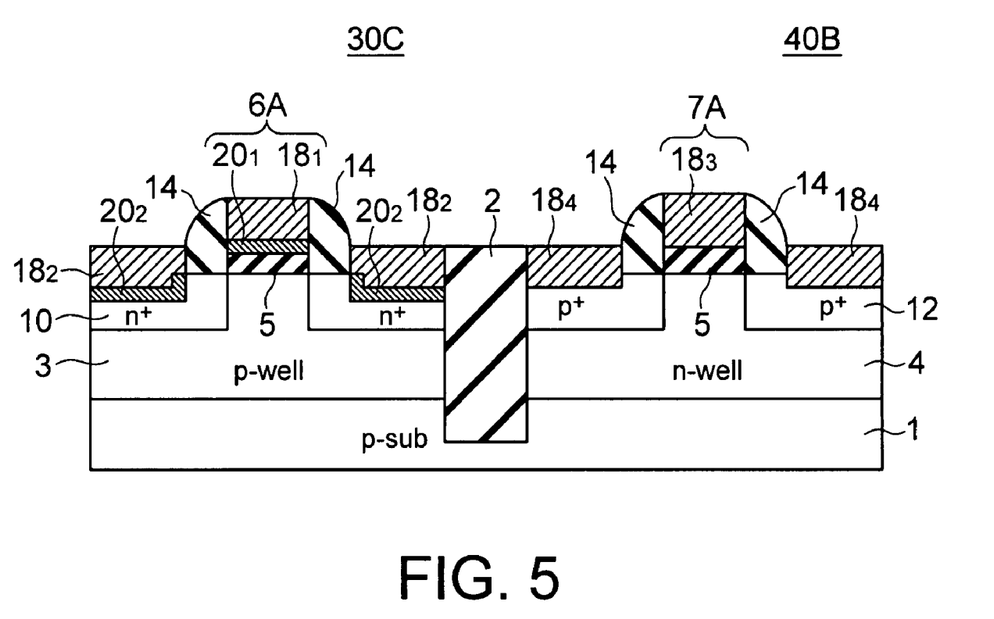
FIG. 5 is a cross-sectional view of a semiconductor device in accordance with a fourth embodiment.

FIG. 5 is a cross-sectional view of a semiconductor device in accordance with a fourth embodiment of the present invention. The semiconductor device of this embodiment is a CMISFET that includes an n-type MISFET 30C and a p-type MISFET 40B. The n-type MISFET 30C is formed on a p-type well 3 of a p-type silicon substrate 1, an has the same structure as the n-type MISFET 30 of the first embodiment shown in FIG. 1, except that the gate electrode 6 is replaced with a gate electrode 6A. This gate electrode 6A includes a Ni$_3$Si layer 18$_1$ formed on a gate insulating film 5 made of silicon dioxide with a film thickness of 2 nm or less, and an Er segregating layer 20$_1$ having Er segregated between the Ni$_3$Si layer 18$_1$ and the gate insulating film 5. In the Er segregating layer 20$_1$, Er is segregating with areal density of $2\times10^{14}$ cm$^{-2}$ or higher. The thickness of the Er segregating layer 20$_1$, is 1 nm or less.

Meanwhile, the p-type MISFET 40B is formed on an n-type well 4 of the p-type silicon substrate 1, and has the same structure as the p-type MISFET 40 of the first embodiment shown in FIG. 1, except that the gate electrode 7 is replaced with a gate electrode 7A. This gate electrode 7A includes a Ni$_3$Si layer 18$_3$ formed on a gate insulating film 5 made of silicon dioxide with a film thickness of 2 nm or less. In the gate electrode 7A, an Er segregating layer is not formed. Accordingly, the gate electrode 7A is completely silicided.

In this embodiment, the distance between the source and the drain of each gate structure formed with a gate insulating film and a gate electrode (the gate length) is preferably 30 nm or shorter.

In this embodiment, the silicide layers of the sources and drains structures of the transistors of both conductivity types are the same as the gate electrode. Thus, the contact resistance can be reduced as in the first embodiment.

Also, the gate electrodes of the CMISFET of this embodiment should preferably have the same work functions as the work functions of the gate electrodes with polycrystalline silicon layers of the CMISFET of the first embodiment. More specifically, the work function in the n-type MISFET is preferably 4.05 eV of the conduction band end of Si, and the work function in the p-type MISFET is preferably 5.17 eV of the valence band end of Si. However, the operational threshold voltage can be controlled by adjusting the impurity concentration in the channel, as long as the work function is within ±0.3 eV from each forbidden band end. Accordingly, a desired operational threshold voltage can be achieved, when the work function is in the range of 3.75 eV to 4.35 eV in the n-type MIS transistor, and in the range of 4.87 eV to 5.47 eV in the p-type MIS transistor. Here, a "work function" is generally an effective work function at the interface between a gate electrode and a gate insulating film, and is represented by a value determined by the extrapolation value and the impurity concentration in the Si substrate in a case where the thickness of the gate oxide film with the flat-band voltage with capacitance-voltage characteristics in a MIS capacitor is zero. If the gate insulating film is a silicon oxide film, the pinning coefficient at the interface between the gate electrode and the gate insulating film is 1, and the vacuum work functions of the gate electrode material, or the work functions at the interfaces that determine the Fermi level and the operational voltage of the transistors, become the same. Since the gate electrode of the p-type MISFET of this embodiment is $Ni_3Si$, the work function is 4.9 eV, which is a value required for the p-type MISFET.

In the n-type MISFET, on the other hand, the work function at the interface between the gate electrode and the gate insulating film is modulated by the Er segregating layers $20_2$. With the Er segregating layers $20_2$ of $2 \times 10^{14}$ $cm^{-2}$ being interposed, the variation in SBH at the interface with silicon having a pinning coefficient of 0.3 is 0.26 eV, as shown in FIG. 2. However, as for the gate electrode, the variation of 0.26 eV is the variation in work function at the interface with the silicon oxide film having a pinning coefficient of 1, and accordingly, the modulation effect here is about 3.34 times larger than the modulation effect at the interface with the silicon. As a result, in the n-type MISFET of this embodiment, a decrease of 0.87 eV (=0.26 eV×3.34) is caused in the work function, and a work function of 4.03 eV is obtained. In a case where a gate insulating film having a smaller pinning coefficient than 1 unlike the silicon oxide film is employed, the areal density of the added metal element at the interface should be adjusted so that the work function falls within the above range.

Accordingly, with the structure of this embodiment, the contact resistance of the source and drain can be lowered, and at the same time, the work function of the gate electrode can be controlled. In this embodiment, the gate electrode is a silicide having metallic properties, and can restrict depletion of the gate electrode that hinders high performances of the device in a case where the gate electrode is made of polycrystalline silicon. Also, as will be described in the later explanation of a manufacturing method, a metal gate electrode can be more easily formed than in conventional cases, since the gate and the source and drain have the same structures.

As described above, in accordance with this embodiment, the interfacial resistance between the silicide and the source and drain of the n-type MISFET can be reduced.

Fifth Embodiment

Figure 6:
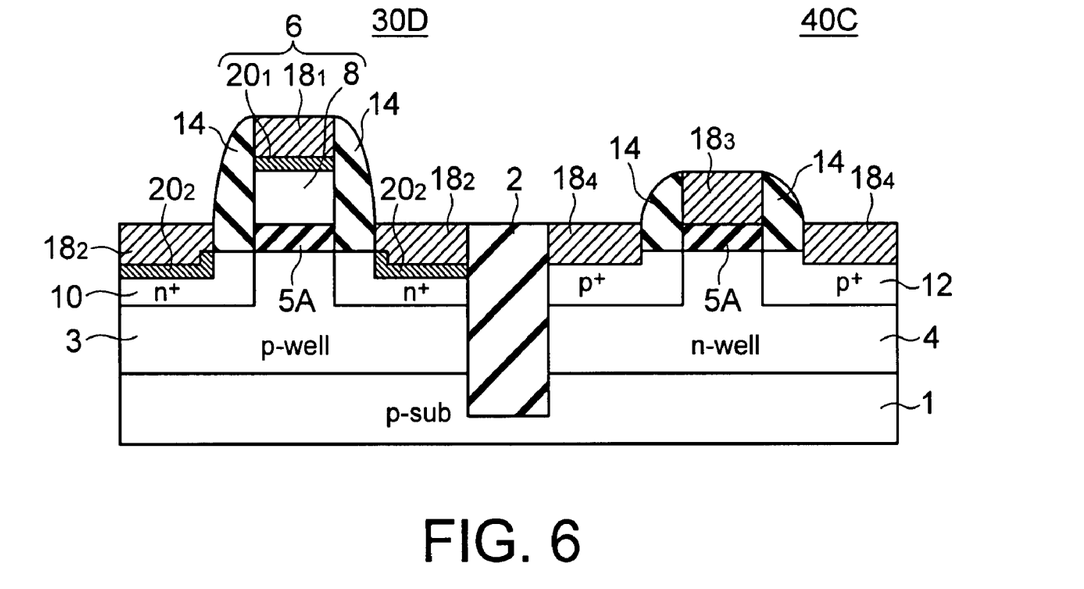
FIG. 6 is a cross-sectional view of a semiconductor device in accordance with a fifth embodiment.

FIG. 6 is a cross-sectional view of a semiconductor device in accordance with a fifth embodiment of the present invention. The semiconductor device of this embodiment is a CMISFET that includes an n-type MISFET 30D and a p-type MISFET 40C. The n-type MISFET 30D is formed on a p-type well 3 of a p-type silicon substrate 1, and has the same structure as the n-type MISFET 30 of the first embodiment shown in FIG. 1, except that the gate insulating film 5 made of $SiO_2$ is replaced with a gate insulating film 5A made of a high-permittivity material containing Hf as a main component. The p-type MISFET 40C is formed in an n-type well 4 of the p-type silicon substrate 1, and has the same structure as the p-type MISFET 40B of the fourth embodiment shown in FIG. 5, except that the gate insulating film 5 is replaced with a gate insulating film 5A made of a high-permittivity material containing Hf as a main component.

In a case where a high-permittivity material containing Hf as a main component is used for the gate insulating film, if the gate electrode on the gate insulating film of the p-type MISFET is made of polycrystalline silicon having a high boron concentration as in the first embodiment, the threshold voltage of the transistors becomes higher due to the Fermi-level pinning phenomenon. To counter this problem, in this embodiment, a desired operational threshold voltage is achieved by forming the gate electrode with $Ni_3Si$ on the gate insulating film of the p-type MISFET, and at the same time, depletion in the gate electrode is restricted so as to generate more carriers in the channel. Thus, a p-type MISFET that can operate at a high speed can be obtained.

In this embodiment, the Er concentration at the interface with the gate insulating film of the n-type MISFET should preferably be $5 \times 10^{14}$ $cm^{-2}$ or higher. Here, the Er concentration should be 1/10 of the element that is the main component of the electrode. If the Er segregating layers are in contact with the gate insulating film as in the fourth embodiment, the gate insulating film is reduced by Er, and the reliability of the device is degraded. In the structure of this embodiment, on the other hand, a polycrystalline silicon layer is formed between the gate insulating film and each Er segregating layer, so as to avoid the above problem. In a case where the main component of the gate insulating film contains a metal having larger negative energy for generation than an Er oxide, the reduction reaction by Er is not caused, and there is no need to employ the gate structure of this embodiment. Such a problem is not caused in the source and drain, and the SBH becomes smaller as the Er concentration at the interface increases as shown in FIG. 2. Accordingly, the parasitic resistance is reduced, and the device performance is further improved.

As described above, the interfacial resistance between the silicide and the source and drain of the n-type MISFET of this embodiment can also be reduced as in the first embodiment.

Sixth Embodiment

Figure 7:
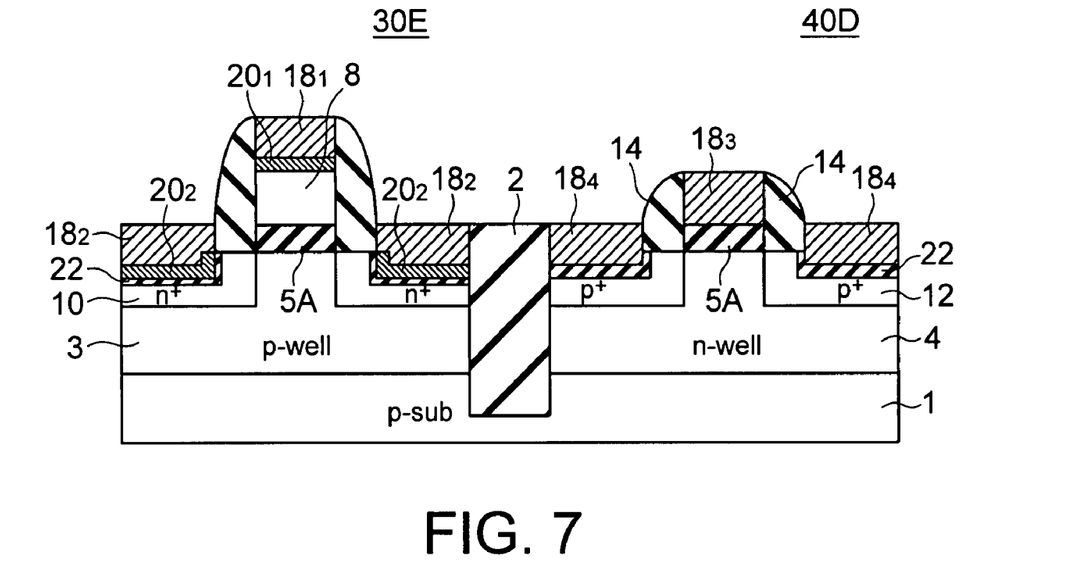
FIG. 7 is a cross-sectional view of a semiconductor device in accordance with a sixth embodiment.

FIG. 7 is a cross-sectional view of a semiconductor device in accordance with a sixth embodiment of the present invention. The semiconductor device of this embodiment is a CMISFET that includes an n-type MISFET 30E and a p-type MISFET 40D. The n-type MISFET 30E is formed in a p-type well 3 of a p-type silicon substrate 1, and has the same structure as the n-type MISFET 30D of the fifth embodiment shown in FIG. 6, except that silicon nitride films 22 of 0.5 nm in film thickness are provided as the interface layers at the interfaces between silicide layers $18_2$ and $n^+$-type diffusion layers 10. Er segregating layers $20_2$ are located on the sides of the $Ni_3Si$ layers $18_2$ with respect to the silicon nitride films 22. The p-type MISFET 40C is formed in an n-type well 4 of the p-type silicon substrate 1, and has the same structure as the p-type MISFET 40C of the fifth embodiment shown in FIG. 6, except that silicon nitride films 22 of 0.5 nm in film thickness are provided as the interface layers at the interfaces between silicide layers 18₄ and p⁺-type diffusion layers 12. The arrangement of the silicon nitride films 22 at the interfaces between the Ni₃Si layers and the diffusion layers of the source and drain in this embodiment is the same as the arrangement in the third embodiment shown in FIG. 4. The effect of the arrangement is the same as that in the third embodiment, as the SBH can vary with the vacuum work function of the electrode. As a result, the contact resistance (interfacial resistance) can be reduced, and a complementary MISFET that can perform high-speed operations can be obtained.

Although the structure of each of the first through sixth embodiments is formed on a bulk silicon substrate, it may be formed on a SOI (Silicon-on-Insulator) substrate. In such a case, MISFETs are fully depleted transistors. The above embodiments may also be applied to three-dimensional devices such as Fin FETs. The source/drain structure and the gate electrode structure of any of the above embodiments may also be formed on a Ge substrate or a GOI (Ge-on-Insulator) substrate. In such a case, NiGe layers, instead of NiSi layers, may be formed through a solid-state reaction between Ni and Ge.

Although Si is used in the channel regions in the first through sixth embodiments, it is possible to use a plastically deformed silicon with greater mobility than Si.

Seventh Embodiment

Figure 8:
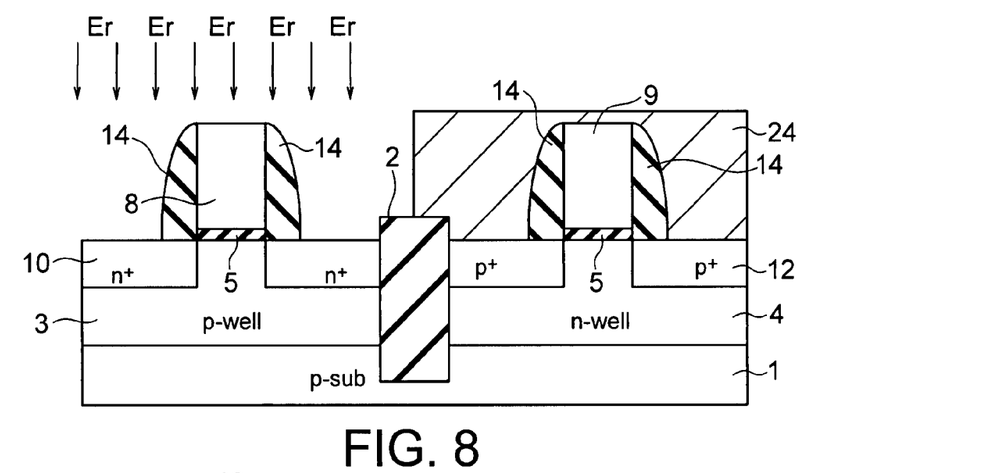
FIG. 8 is a cross-sectional view illustrating a method for manufacturing a semiconductor device in accordance with a seventh embodiment.
Figure 9:
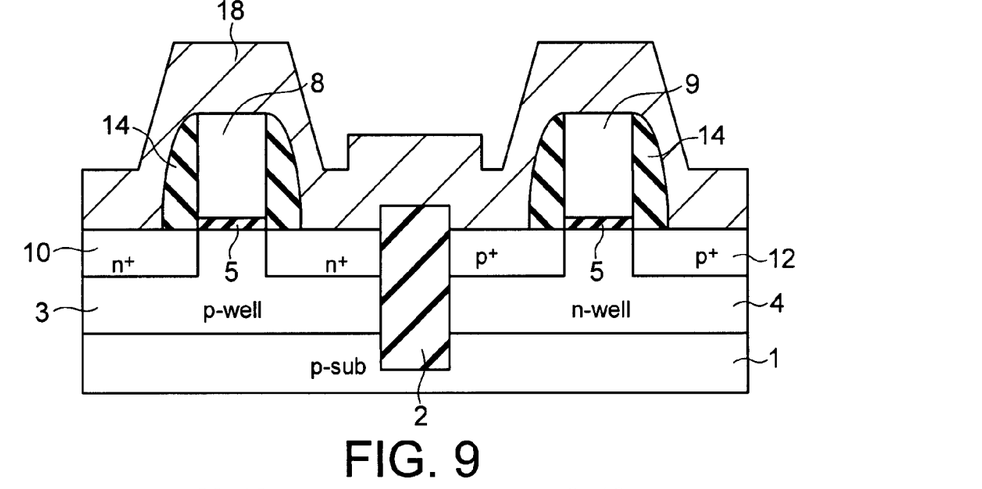
FIG. 9 is a cross-sectional view illustrating a method for manufacturing a semiconductor device in accordance with the seventh embodiment.
Figure 10:
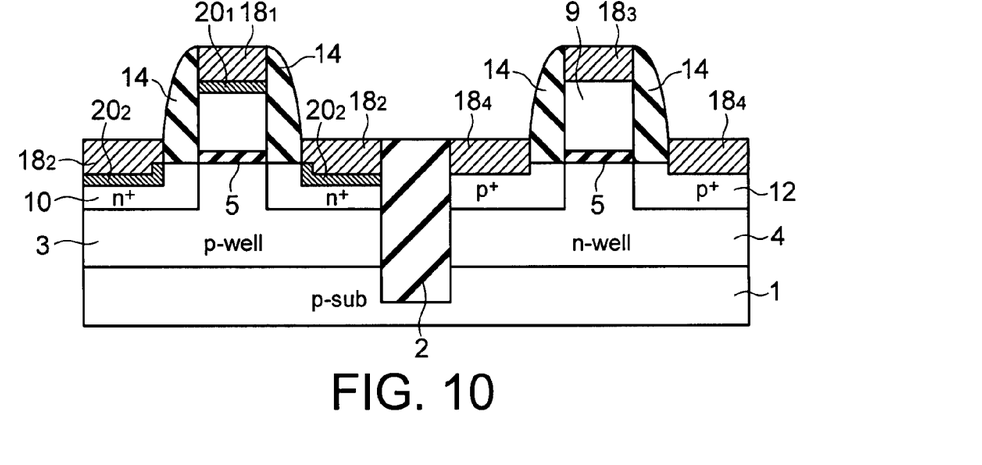
FIG. 10 is a cross-sectional view illustrating a method for manufacturing a semiconductor device in accordance with the seventh embodiment.

Referring now to FIGS. 8 through 10, a method for manufacturing a semiconductor device in accordance with a seventh embodiment of the present invention is described. FIGS. 8 through 10 are cross-sectional views showing procedures for manufacturing the semiconductor device in accordance with this embodiment. The semiconductor device to be manufactured by the method of this embodiment is the same as the semiconductor device of the first embodiment shown in FIG. 1.

First, as shown in FIG. 8, the device isolating region 2 is formed in the p-type silicon substrate 1. The device isolating region 2 can be formed by a local oxidation technique or a shallow trench technique. Alternatively, the device isolating region 2 may have a mesa form. Ion implantation is then performed to form the p-type impurity regions (p-type well) 10 and the n-type impurity regions (n-type well) 12.

The silicon thermal oxide films 5 to be gate insulating films are then formed on the surface of the silicon substrate 1. In a case where a high-permittivity material is used for the gate insulating films, a metal oxide formed by MOCVD or ALD, or a metal oxide having Si or N added thereto may be used, instead of the silicon thermal oxide films (see FIG. 8).

A polycrystalline silicon layer to be the gate electrodes is then deposited by LPCVD (Low-Pressure Chemical Vapor Deposition). Patterning is performed by a lithography technique, and the polycrystalline silicon layer is patterned by dry etching. As a result, the polycrystalline silicon layers 8 and 9 are formed (see FIG. 8)

Arsenic and boron ions are then implanted so as to form the diffusion layers 10 and 12 of the n-type MISFET and the p-type MISFET (see FIG. 8). More specifically, arsenic is implanted into the polycrystalline silicon layer 8, and boron is implanted into the polycrystalline layer 9. The source and drain may have an elevated source/drain structure through selective epitaxial growth, so as to restrict a short-channeling effect as the device characteristics. At the time of the formation of an elevated source/drain structure, impurities may also be introduced.

Figure 11:
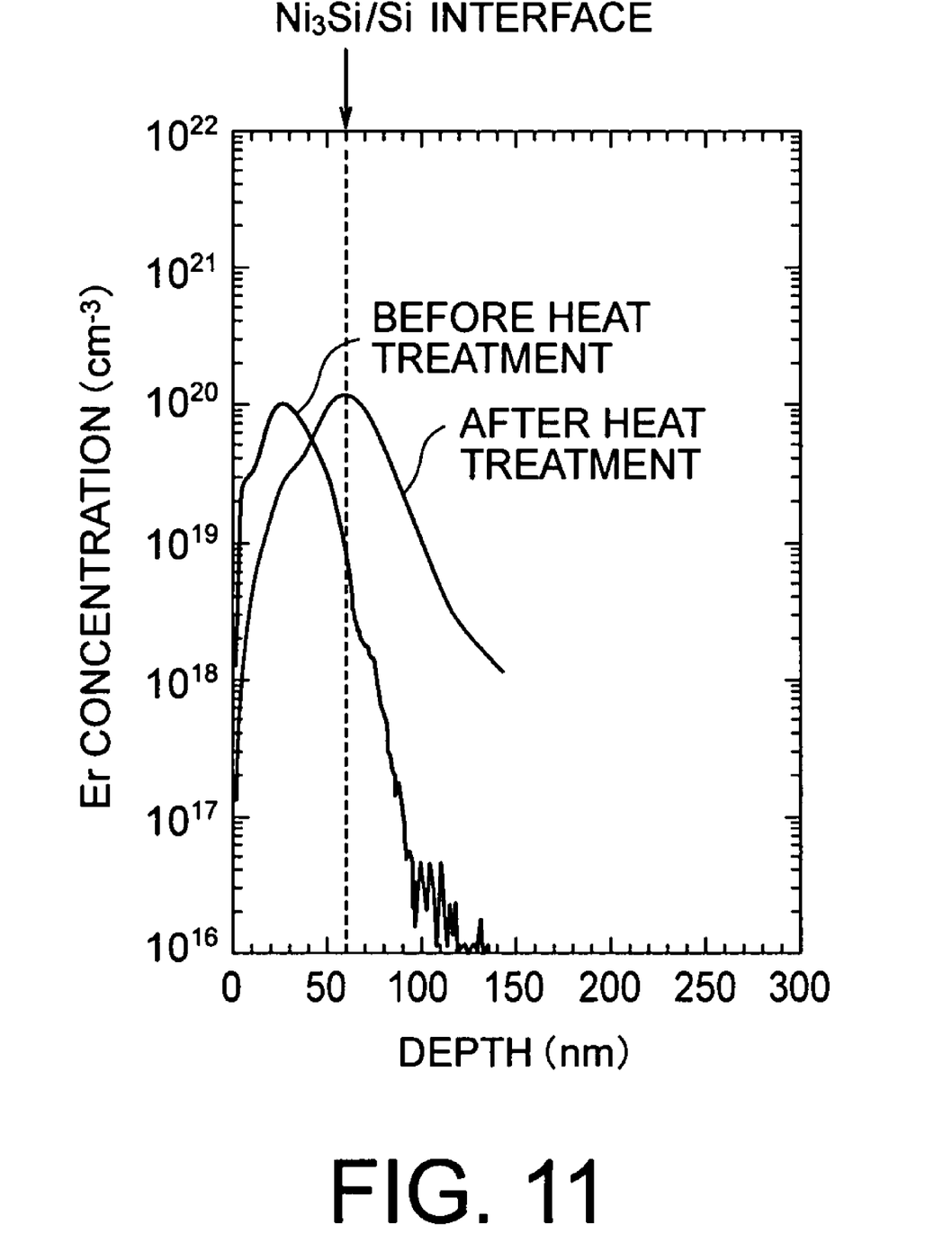
FIG. 11 shows the Er distribution in the SIMS depth direction immediately after Er ion implantation into polycrystalline Si in a case where $Ni_3Si$ formation is carried out after the Er ion implantation.

The sidewalls 14 for insulating the gate electrodes from the sources and drains are then formed. Only the n-type MIS transistor formation region is then exposed by a lithography technique, and the p-type MISFET formation region is covered with a resist pattern 24 or a hard mask. Er ions are then implanted (see FIG. 8). The implantation energy should be 10 keV to 50 keV, and the dose amount should be 1×10¹⁵ atoms cm⁻² to 1×10¹⁶ atoms cm⁻² After the resist pattern 24 or the hard mask is removed, Ni is deposited by a sputtering technique, so as to form a Ni layer 18 of 10 nm in film thickness (see FIG. 9). A heat treatment is then carried out at 300° C., so that the Ni₃Si layers 18₁, 18₂, 18₃, and 18₄ are formed over the diffusion layers 10 and 12 and the gate electrodes 8 and 9 in a self-aligning fashion. At this point, the Er already introduced into the n-type MIS transistor through the ion implantation is segregated at the interface between the Ni₃Si and the silicon by virtue of a "snowplow effect". FIG. 11 illustrates the segregation. FIG. 11 shows the Er distribution in the SIMS depth direction, with the Er dose amount being 5×10¹⁴ cm⁻². With a high-concentration dose amount, the peak concentration becomes higher, and the impurity distribution does not change. The implantation energy in the example case shown in FIG. 11 is 50 keV. If the accelerating voltage is lowered, the Er distribution becomes steeper, and Er ions are distributed to a region closer to the Si surface. By virtue of the snowplow effect, the peak point is moved to the interface with the Ni₃Si, while the Er peak concentration remains the same as before the heat treatment, as can be seen from FIG. 11. After the heat treatment, the Er profile maintains its steepness.

The sidewalls 14 and the unreacted Ni on the device isolating region 2 are then selectively removed with an acid solution, so as to produce the MISFET shown in FIG. 10.

As described above, in accordance with this embodiment, the interfacial resistance between the silicide layers and the diffusion layers of the n-type MISFET and the p-type MISFET can be made lower through the simplest possible processes.

Since the semiconductor device manufactured by the manufacturing method of this embodiment has the same structure as the semiconductor device of the first embodiment shown in FIG. 1, the same effects as those of the first embodiment can be achieved in this embodiment.

Eighth Embodiment

Figure 12:
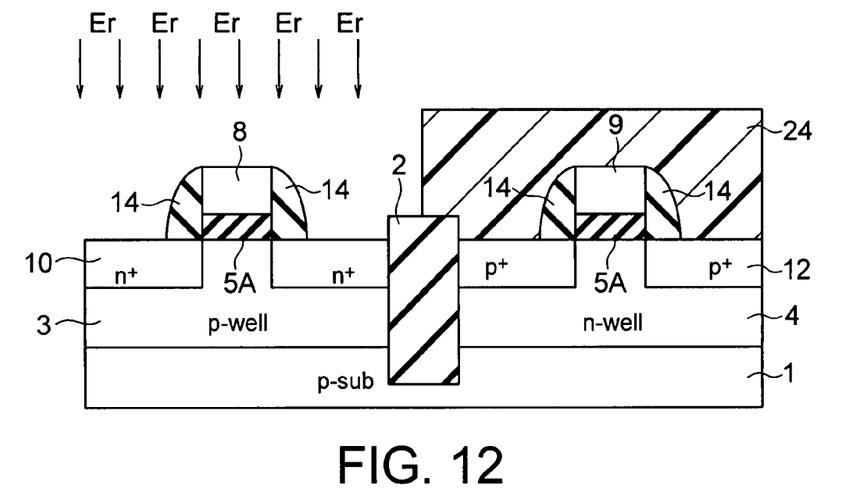
FIG. 12 is a cross-sectional view illustrating a method for manufacturing a semiconductor device in accordance with an eighth embodiment.
Figure 13:
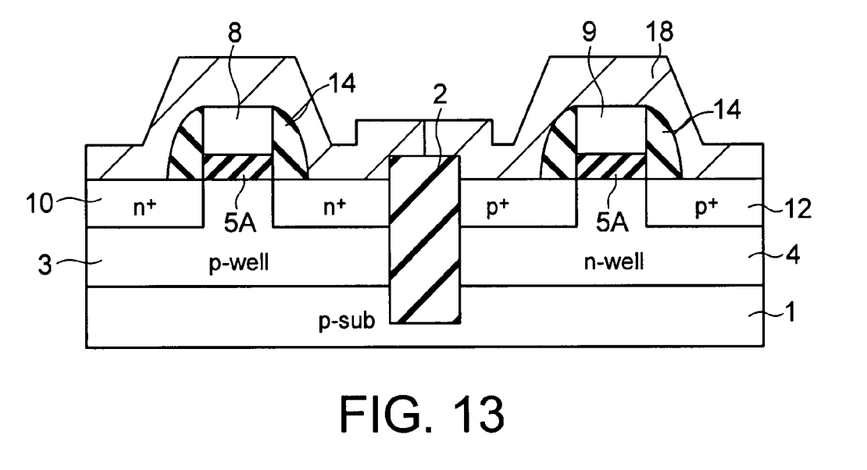
FIG. 13 is a cross-sectional view illustrating a method for manufacturing a semiconductor device in accordance with the eighth embodiment.
Figure 14:
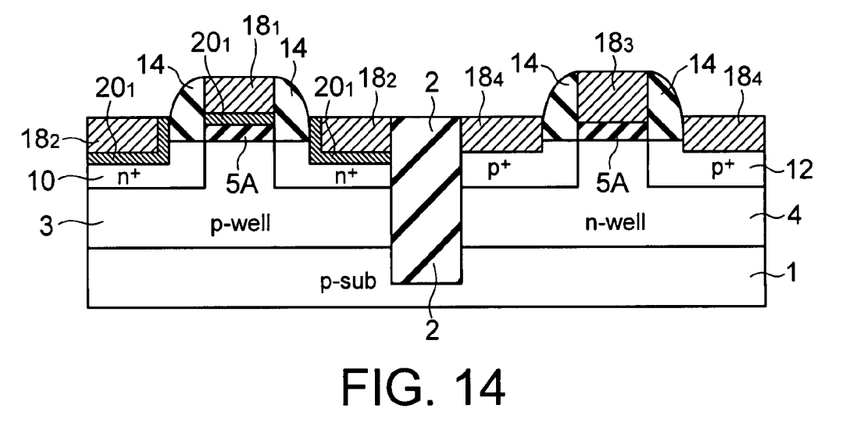
FIG. 14 is a cross-sectional view illustrating a method for manufacturing a semiconductor device in accordance with the eighth embodiment.

Referring now to FIGS. 12 through 14, a method for manufacturing a semiconductor device in accordance with an eighth embodiment of the present invention is described. FIGS. 12 through 14 are cross-sectional views showing procedures by the manufacturing method of this embodiment. The semiconductor device to be manufactured by the method of this embodiment is the same as the semiconductor device of the fourth embodiment shown in FIG. 5.

First, as shown in FIG. 12, the device isolating region 2, the gate electrodes 8 and 9, the source and drain 10 and 12, and the insulating sidewalls 14 are formed. The formation of those components is carried out through the same procedures as those by the manufacturing method of the seventh embodiment shown in FIG. 8. At this point, the heights of the polycrystalline silicon layers 8 and 9 of the gate electrodes are equivalent to the silicon consumption amount (depth) at the time of the formation of Ni₃Si layers on the diffusion layers 10 and 12. With such heights, the polycrystalline silicon layers 8 and 9 can be fully silicided. The gate insulating films 5A is made of a high-permittivity material containing Hf as a main component, for example.

Only the n-type MISFET formation region is then exposed by a lithography technique, and the p-type MISFET formation region is covered with a resist pattern 24 or a hard mask.

Er ions are then implanted (see FIG. 12). The implantation energy should be 50 keV, and the dose amount should be $1\times10^{15}$ atoms cm$^{-2}$ to $1\times10^{16}$ atoms cm$^{-2}$. After the resist pattern 24 or the hard mask is removed, Ni is deposited by a sputtering technique, so as to form a Ni film 18 of 10 nm in film thickness (see FIG. 13). A heat treatment is then carried out at 300° C., so that the Ni$_3$Si layers $18_1$, $18_2$, $18_3$, and $18_4$ are formed over the diffusion layers 10 and 12 and the polycrystalline silicon films 8 and 9 in a self-aligning fashion. At this point, the Er already introduced into the n-type MIS transistor through the ion implantation is segregated at the interface between the Ni$_3$Si layers and the silicon by virtue of a "snowplow effect". Thus, the Er segregating layers $20_2$ are formed. The polycrystalline silicon films 8 and 9 react with all the Ni existing before the interface with the gate insulating films, so as to form the Ni$_3$Si layers $18_1$ and $18_3$.

The sidewalls 14 and the unreacted Ni on the device isolating region 2 are then selectively removed with a solution of sulfuric acid and hydrogen peroxide (1:1), so as to produce the semiconductor device shown in FIG. 14. The "snowplow effect" has the same influence in this case, and the Er segregating layer $20_1$ is formed at the interface between the Ni$_3$Si layer $18_1$ of the gate electrode and the gate insulating film 5A in the n-type MISFET.

As described above, in accordance with this embodiment, the interfacial resistance between the silicide layers and the diffusion layers of the n-type MISFET and the p-type MISFET can be made lower through the simplest possible processes.

Since the semiconductor device manufactured by the manufacturing method of this embodiment has the same structure as the semiconductor device of the fourth embodiment shown in FIG. 5, the same effects as those of the fourth embodiment can be achieved.

Various modifications and changes may be made to the above embodiments without departing from the scope of the present invention.

As described so far, in each of the above embodiments of the present invention, the metal main components of the silicide layers on the diffusion layers in the n-type MISFET and the p-type MISFET are the same, and a metal element having a smaller vacuum work function than the main component metal is segregated at the interface only in the n-type MISFET. With this structure, the interfacial resistance can be reduced in both the n-type MISFET and the p-type MISFET. As a result, a complementary MISFET that can operate at a high speed can be produced. Also, complication in the manufacturing process is not caused or is minimized.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor device comprising:
a p-type semiconductor substrate;
a first source and drain regions separately provided in the semiconductor substrate, each of the first source and drain regions including:
an n-type diffusion layer;
a first silicide layer formed on the n-type diffusion layer and containing a first metal element as a main component having a vacuum work function of 4.6 eV or greater; and
a segregating layer located at an interface between the n-type diffusion layer and the first silicide layer and containing at least one second metal element selected from the group of scandium elements or lanthanoid, a region of the segregating layer having an areal density of $1\times10^{14}$ cm$^{-2}$ or higher and a thickness smaller than 1 nm;
a first gate insulating film provided on a region between the first source and drain regions of the semiconductor substrate; and
a first gate electrode provided on the first gate insulating film.

2. The device according to claim 1, wherein the first silicide layer contains at least one of Ni, Co, Pt, and Pd, as the first metal element.

3. The device according to claim 2, wherein the first silicide layer is formed of a silicide with the largest composition ratio of the first metal element.

4. The device according to claim 1, wherein the first gate electrode includes a second silicide layer having the first metal element as a main component, and a second layer containing the second metal element.

5. The device according to claim 1, further comprising an insulating film provided between the n-type diffusion layer and the segregating layer.

6. The device according to claim 1, wherein the second metal element is erbium.

* * * * *